United States Patent [19]
Berken et al.

[11] Patent Number: 5,740,062
[45] Date of Patent: Apr. 14, 1998

[54] WAFER POSITIONING SYSTEM

[75] Inventors: Lloyd M. Berken, Fremont; Frederik W. Freerks, Cupertino; William H. Jarvi, San Jose; Hatice Sahin, Cupertino, all of Calif.

[73] Assignee: Applied Materials, Inc., Santa Clara, Calif.

[*] Notice: The term of this patent shall not extend beyond the expiration date of Pat. No. 5,563,798.

[21] Appl. No.: 723,002

[22] Filed: Sep. 30, 1996

Related U.S. Application Data

[63] Continuation of Ser. No. 224,622, Apr. 5, 1994, Pat. No. 5,563,798.

[51] Int. Cl.⁶ .................................................... G05B 11/01
[52] U.S. Cl. ........................ 364/478.06; 364/167.01; 901/47; 414/935; 318/640
[58] Field of Search ............... 364/478.01, 478.02, 364/478.06, 478.16–478.18, 554, 167.01, 468.19–468.21, 468.28; 901/47; 414/225, 783, 416, 935–939; 356/400; 250/442.11, 492.21, 548, 561, 492.2; 318/568.16, 640

[56] References Cited

U.S. PATENT DOCUMENTS

| | | | |
|---|---|---|---|
| 4,697,089 | 9/1987 | Drage | 250/561 |
| 4,770,590 | 9/1988 | Hughes et al. | 901/47 |
| 4,819,267 | 4/1989 | Cheng et al. | 364/167 |
| 4,836,733 | 6/1989 | Hertel et al. | 414/225 |
| 5,054,991 | 10/1991 | Kato | 414/783 |
| 5,194,743 | 3/1993 | Aoyama et al. | 250/548 |
| 5,483,138 | 1/1996 | Shmookler et al. | 318/568 |
| 5,563,798 | 10/1996 | Berken et al. | 364/478.06 |

*Primary Examiner*—Reba I. Elmore
*Assistant Examiner*—Steven R. Garland
*Attorney, Agent, or Firm*—William Konrad

[57] ABSTRACT

A wafer positioning system determines the position of a wafer during processing by monitoring the position of the wafer transport robot as the robot transports the wafer by one or more position sensors. The wafer positioning system incorporates a transparent cover on the surface of the wafer handling chamber and two optical position sensors disposed on the surface of the transparent cover. The position sensors direct light through the wafer handling chamber to reflectors near the floor of the chamber which reflect the light back to the position sensors. A detector within the position sensor detects when the beam path from the position sensor to the reflector is uninterrupted. As wafers are transported through the chamber, the edge of the transported wafer interrupts the position sensor beam path causing the output of the position sensor to switch states. When the position sensor output switches, the position of the wafer transport robot is measured. At least two data points are measured to establish the wafer position. If the wafer is not at its nominal position, the position of the wafer transport robot is adjusted to compensate for the wafer misalignment.

3 Claims, 11 Drawing Sheets

WAFER POSITIONING SYSTEM

This is a continuation of U.S. patent application Ser. No. 08/224,622, filed Apr. 5, 1994, now U.S. Pat. No. 5,563,798.

FIELD OF THE INVENTION

The present invention relates to automated wafer processing equipment and, in particular, to equipment for robotically transporting wafers between storage and processing stations.

BACKGROUND OF THE INVENTION

A common configuration for semiconductor processing equipment utilizes a number of different processing chambers accessible from a central wafer storage and handling ("transfer") chamber. FIG. 1 schematically illustrates a semiconductor processing system having such a configuration. Wafers are typically loaded into the processing system in wafer cassettes and then the wafers are individually transferred from the cassettes to a wafer storage elevator within the central transfer chamber. A wafer transport robot moves individual wafers from the wafer storage elevator through valves in the transfer chamber wall, into the different processing chambers, and then between chambers to effect different processing steps. Movement of semiconductor wafers within processing equipment is accomplished using automated wafer handling techniques to allow for the complete automation of the fabrication process. In addition to the system illustrated in FIG. 1, many other configurations of wafer processing equipment use automated wafer handling techniques.

Because wafer processing occurs in a vacuum or near vacuum environment and because cost considerations necessitate fast pumping times to facilitate high wafer throughput, the total volume of a wafer processing system is limited. Consequently, the clearances and tolerances within wafer processing equipment are typically limited by space considerations. For example, one type of wafer storage elevator stores wafers in a recess that allows only a few millimeter clearance to either side of the wafer. Misaligned wafers may be dislodged from the wafer storage elevator or may be damaged in other ways. Considering the complexity of semiconductor devices and the number of devices on each wafer, each wafer start represents a substantial investment and any level of wafer breakage is undesirable. Accordingly, wafer transfers must be precise. Normally, stepper motor driven wafer transport robots under computer control are capable of repeatedly transporting wafers through a processing system with great precision. However, the effectiveness of such wafer handling techniques can be greatly diminished if the initial wafer position with respect to the wafer transport robot is not known accurately.

Some types of wafer processing equipment use one or more techniques to measure a wafer's position and to ensure that the wafer is situated at a predefined position. For example, U.S. Pat. No. 4,819,167 to Cheng, et al., entitled "System and Method for Detecting the Center of an Integrated Circuit Wafer," describes a wafer processing system which includes a sensor array for determining the position of a wafer as it is loaded from an external cassette onto an internal wafer storage elevator. The Cheng wafer positioning system ensures that wafers loaded into the processing equipment are accurately positioned on a given level of the wafer storage elevator. Using a system in accordance with the teachings of the Cheng patent ensures that wafers stored within the wafer storage elevator are initially at a well defined position with respect to the wafer transport robot when the wafers are accessed by the wafer transport robot.

Systems which incorporate the teachings of the Cheng patent nevertheless experience unacceptable levels of wafer breakage. This is likely caused by inaccurate wafer accessing operations or by wafers being dislodged from their nominal position either during processing or transport. Thus, further measures are desirable to ensure that wafers are at their predetermined positions. Some wafer processing systems use capacitive position sensors within the blade of the wafer transport robot to detect if the wafer is improperly seated on the blade. Such capacitive systems are often inaccurate and provide too unreliable of a signal to detect most wafer misalignment problems.

A second type of centerfinding system is described in U.S. patent application Ser. No. 07/975,197, entitled "System and Method for Automated Positioning of a Substrate in a Processing Chamber," which lists Shmookler, et al., as inventors (hereinafter, the "Shmookler system"). application Ser. No. 07/975,197 was filed on Nov. 12, 1992, now abandoned and is assigned to the assignee of the present invention. The Shmookler system is a wafer centerfinding system which uses four photoelectric position sensors to locate the center of a wafer as the wafer is moved between processing chambers. An array of optical sources are disposed above the central wafer transport chamber and a corresponding array of optical detectors are disposed below the chamber. The illustrated sensor array allows the identification of wafer positions, but requires that the wafer transport chamber be optically accessible from both the top and the bottom of the chamber. This photoelectric sensor array is arranged so that the light travels along a path generally perpendicular to the plane in which the wafer is transported. In practice, this type of sensor geometry may lead to erroneous position information due to multiple reflections from the surfaces of the top and bottom chamber covers and from the wafer. To compensate for such erroneous position data, the Shmookler system samples more data points than necessary, discarding data that does not fall within expected limits.

The Shmookler system uses a data collection scheme which relies on particular points on the edge of a wafer crossing the four sensor array in a particular order. This scheme works well when wafers are positioned near to their nominal position. However, wafers that are in danger of breaking in the course of a transport operation may be dislodged from their nominal position by a large amount. For such substantially misaligned wafers, the Shmookler system will not appropriately identify the wafer position, and wafers that are substantially out of position may consequently be broken.

SUMMARY OF THE PREFERRED EMBODIMENTS

A preferred embodiment of the present invention includes a wafer handling chamber having a vacuum sealable opening for admitting wafers from a region external to the wafer handling chamber. At least one wafer processing chamber having an opening large enough to admit a wafer is attached to the wafer handling chamber. A wafer storage apparatus having a plurality of locations for storing wafers is located within the wafer handling chamber. In addition, this preferred embodiment of the present invention includes a wafer transport robot capable of translating a wafer along a first coordinate direction and along a second coordinate direction. Preferably the wafer transport robot includes a blade adapted for carrying wafers. At least one position sensor is disposed so as to detect an edge of a wafer being transported from the wafer storage apparatus to a position within the wafer handling chamber disposed away from the wafer storage apparatus.

In accordance with a further aspect of this preferred embodiment, the present invention includes means for determining a wafer position with respect to the wafer transport robot. Yet a further aspect of the present invention includes means for adjusting the wafer transport robot to correct the positioning of a misaligned wafer. More particularly, the position of a misaligned wafer can be adjusted by altering a set of coordinate positions corresponding to a predetermined destination position by an amount substantially equal and opposite to the wafer's misalignment.

Another preferred embodiment of the present invention includes a wafer handling chamber with at least a portion of one wall formed from a substantially transparent material. A wafer storage apparatus within the wafer handling chamber has a plurality of locations for storing wafers. Also included is a wafer transport robot capable of translating a wafer along a first coordinate direction and along a second coordinate direction. Preferably, the wafer transport robot has a blade for carrying wafers. This embodiment also includes at least one position sensor comprising a light source disposed external to the wafer handling chamber and aligned to direct a beam of light into the wafer handling chamber. The position sensor includes a reflector within the wafer handling chamber for reflecting at least a portion of the incident beam of light toward a detector disposed external to the wafer handling chamber. The detector and light source are disposed so as to detect an edge of the wafer being transported from the wafer storage apparatus to a position within the wafer handling chamber disposed away from the wafer storage apparatus.

In accordance with yet another preferred embodiment, the present invention comprises a wafer storage apparatus having a plurality of locations for storing a plurality of wafers and a wafer transport robot. The wafer transport robot is capable of placing a wafer at a location within the wafer storage apparatus and of transporting a wafer from the wafer storage apparatus to a plurality of locations. This embodiment also includes a first and a second wafer positioning system. The first wafer positioning system includes a first array of optical sensors generating a first data set corresponding to a first wafer edge position and means for detecting a first wafer position from that first data set. In addition, the first wafer positioning system includes a means for controlling the wafer transport robot to place a wafer at a predetermined position within a location of the wafer storage apparatus. The second wafer positioning system includes at least one optical sensor disposed to generate a second data set corresponding to a second wafer edge position and a means for detecting a second wafer position from the second data set corresponding to the second wafer edge position. Another means controls the wafer transport robot in accordance with the detected second wafer position to place a wafer at a destination position.

In accordance with a further aspect of this preferred embodiment, the second wafer positioning system also includes a means for detecting a misaligned wafer displacement with respect to a nominal wafer position on the wafer transport robot and a means for adjusting the wafer transport robot so that the wafer transport robot places the misaligned wafer substantially at its destination position.

DETAILED DESCRIPTION OF THE PREFERRED EMBODIMENTS

Preferred embodiments of the present invention detect wafer positions as wafers are transported within semiconductor processing equipment and compensate for wafer misalignments when wafers are not at or very near their nominal position on the wafer transport robot. The wafer positioning system of the present invention preferably determines the error in wafer position and compensates for this error by adjusting the linear and rotational position of the wafer transport robot. Positional adjustments are made so that the wafer transport robot will transport the wafer to its nominal position either within the wafer storage elevator or within the destination wafer processing chamber. In particularly preferred embodiments of the present invention, the wafer position is detected only for those transport operations associated with substantial levels of wafer breakage.

Wafer positions are preferably detected by determining the position of the wafer transport robot when the leading and trailing edges of a wafer cross one or more optical beam paths during wafer transport. Positional information derived from these wafer position data points may be compared with predetermined, nominal positional information to determine the extent of the wafer misalignment. This error information is preferably converted into a linear error component and a rotational error component and the linear extension and rotational displacement of the wafer transport robot is adjusted accordingly.

Figure 1:
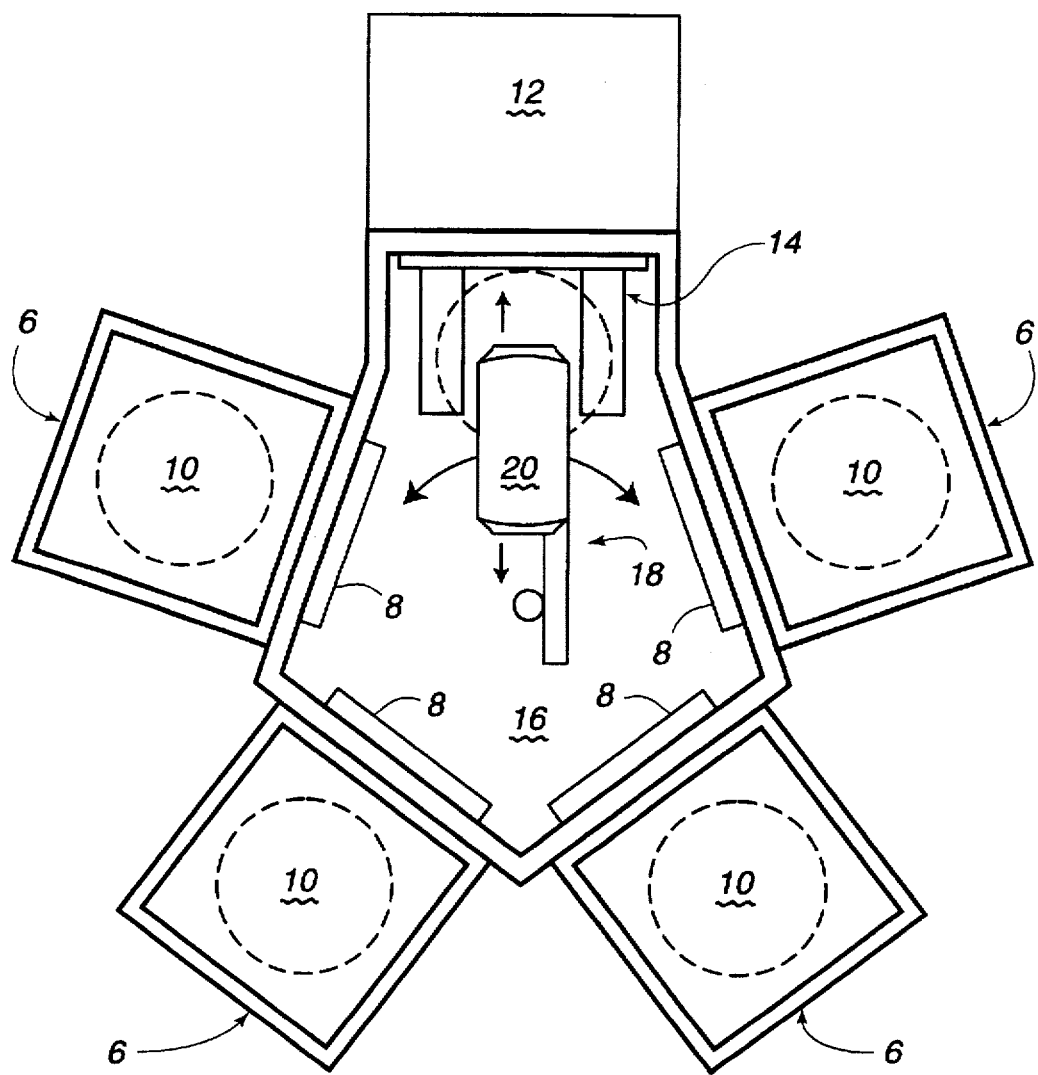
FIG. 1 is a plan view of a semiconductor processing system.

FIG. 1 shows a plan view of a wafer processing system which may accommodate the wafer positioning system of the present invention. The wafer processing system of FIG. 1 consists of a number of individual processing chambers 6 that can be isolated by closing slit valves 8. Wafers 10, for example eight inch silicon wafers, undergo a variety of processing steps within the various processing chambers 6. Typically, a plurality of wafers within a wafer cassette are loaded into the wafer processing system through a chamber 12. Preferably, wafers are loaded into the wafer processing system and onto the wafer storage elevator 14 in accordance with the method taught by U.S. Pat. No. 4,819,167 to Cheng, et al., entitled "System and Method for Detecting the Center of an Integrated Circuit Wafer," assigned to the assignee of the present invention, and incorporated herein by reference. In particular, preferred embodiments of wafer processing systems in accordance with the present invention incorporate the center finder system of the Cheng patent to accurately locate the wafers 10 within the wafer storage elevator.

During processing, wafers 10 are transported from the wafer transfer elevator 14 through the transfer chamber 16 and into the various chambers 6 via the slit valves 8 in the walls of the transfer chamber walls. Movement of wafers between the wafer storage elevator 14 and the various wafer processing chambers 6 is accomplished by means of a wafer transport robot 18. The wafer transport robot 18 is capable of lifting a wafer 10 from the wafer storage elevator 14 and, by a combination of linear and rotational translations, transporting the wafer 10 through a selected open vacuum chamber slit valve 8, and depositing the wafer at the appropriate position within the selected wafer processing chamber 6. Similarly, the wafer transport robot 18 is capable of transporting a wafer 10 from one processing chamber 6 to another and from a processing chamber 6 back to the wafer storage elevator 14.

The linear and rotational translation mechanisms of the wafer transport robot 18 are indicated schematically in FIG. 1. Preferred embodiments of a transport mechanism utilize two stepper motors under the ultimate control of the processing system computer, with one stepper motor controlling linear extension and the other stepper motor controlling rotation. The use and control of such stepper motors is well known in the art. The linear extension mechanism may be a four bar linkage, such as that described in U.S. Pat. No. 4,819,167 to Cheng, et al. As illustrated by the Cheng patent, the wafer transport robot 18 rotates using a stepper motor driven turn table. The description of the wafer transport robot 18, including the four bar linkage and rotation mechanism, contained within U.S. Pat. No. 4,819,167 to Cheng, et al., is incorporated herein by reference.

Ideally, wafers 10 being transported by the wafer transport robot 18 are situated at the wafer's nominal position within the pocket of the blade 20 of the wafer transport robot 18. When the wafer is disposed at its nominal position on the blade 20, the transport robot 18 will accurately move the wafer to its destination position within either the storage elevator 14 or the processing chambers 6. In practice, however, wafers are not always disposed at or substantially near their nominal position on the blade 20, causing the wafer transport robot 18 to move the wafer 10 to a position displaced away from the wafer's intended destination position. Under such circumstances, it is desirable for the wafer positioning system of the present invention to alter the linear and rotational aspect of the wafer transport robot 18 to compensate for the wafer misalignment, thereby ensuring that the wafer 10 is accurately transported to its intended destination. To allow the wafer processing system to correct for positional errors, the wafer processing system monitors the position of wafers being transported to identify which wafers are misaligned.

In preferred embodiments of the present invention, the position of a wafer is detected as the wafer 10 is moved about the transfer chamber 16 by the wafer transport robot 18. The position of the wafer 10 disposed on the blade 20 of the wafer transport robot 18 is measured by extending the wafer transport robot 18 toward the wafer storage elevator 14 and detecting when the leading and trailing edges of the wafer 10 pass by one or more position sensors. At least two data points are taken as the edge of the wafer passes by one or more position sensors. If a single position sensor is used, data points are preferably taken as both the leading and trailing edge of the wafer pass the position sensor. If two position sensors are used, it is preferred that data points are taken as the leading edge of the wafer passes by each of the position sensors. By knowing the linear extension of the wafer transport robot 18 when at least two distinct points on the edge of the wafer pass by position sensors, the position of the wafer can be unambiguously determined. It is preferred that the one or more position sensors be disposed so as to detect a position on the edge of the wafer 10 that overhangs the edge of the blade 20 of the wafer transport robot 18.

Figure 2:
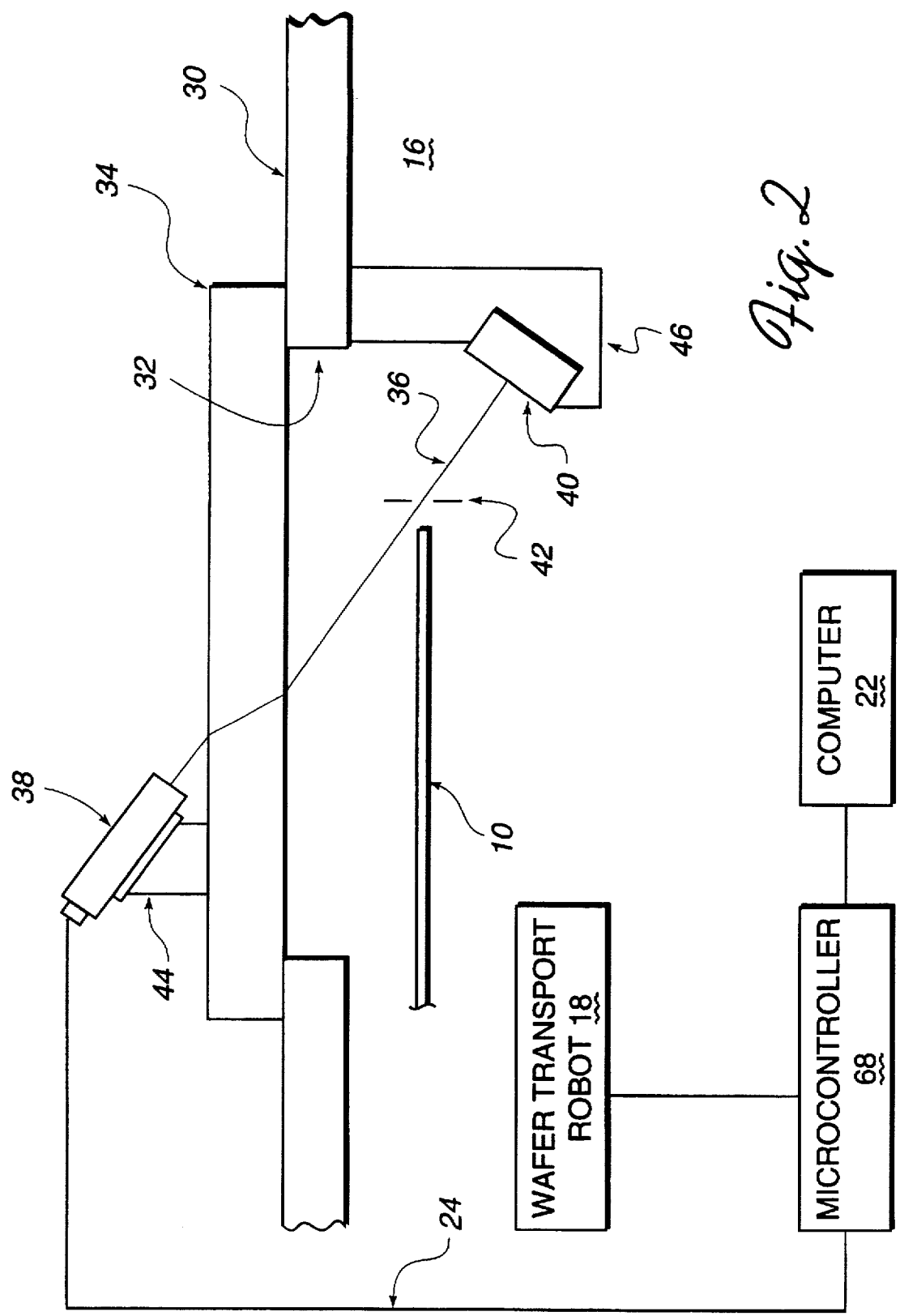
FIG. 2 illustrates a preferred embodiment of a sensor system in accordance with the present invention.

A position sensor for use with the wafer positioning system of the present invention is illustrated in FIG. 2. To aid in the understanding of the present invention, like reference numerals are used to identify the same or similar components in this and the other figures used to illustrate aspects of the present invention. Referring to FIG. 2, a central cover 30, which defines the upper bound of the transfer chamber 16, has a generally circular opening 32 which is sealed with a window 34, which might be a thick plexiglass plate, allowing the interior of the transfer chamber 16 to be viewed from above. One type of position sensor detects when the edge of a wafer 10 interrupts a beam of light 36 passing through the transfer chamber. This may be done in any number of ways. For example, a light source may be disposed above the central cover 30 so as to direct a beam of light through the window 34 onto the surface of an optical detector. The output of the optical detector has a first value when the beam of light is incident on the surface of the optical detector and has a second value when the beam of light is not incident on the optical detector. When the edge of a wafer 10 passes through the optical beam path 36, blocking the path from the light source to the detector, the output of the detector will change from the first value to the second value. By noting the position of the wafer transport robot when the detector output changes values, wafer position information can be determined. Preferably, a microcontroller 68 is provided in the wafer processing system. The microcontroller 68 derives wafer position information from information provided by the wafer transport robot 18 and the position sensor. As is schematically illustrated in FIG. 2, the microcontroller 68 may be coupled to a computer 22, which may be the computer which ultimately controls the operation of the wafer processing system.

FIG. 2 of the present invention illustrates a preferred position sensor in accordance with the present invention. The illustrated position sensor defines an optical beam path 36 and outputs a signal of a first value when the optical beam path is uninterrupted and outputs a signal of a second value when the optical beam path is blocked. It is desirable to minimize the number of electrical connections that must be made to the interior of the wafer processing system. Accordingly, particularly preferred embodiments of the FIG. 2 position sensor locate both the light source and the detector on the outside of transfer chamber 16. This is conveniently accomplished in the embodiment of FIG. 2 with a reflex sensor 38 that includes both a light source and a detector within a single housing. Suitable reflex sensors include the Comet 100 Visible Red Reflex Sensor, DC Model 14102A6517, manufactured by Eaton Corporation of Everett, Wash. Light 36 from the reflex sensor 38 is directed through the window 34 in the central cover 30 into the transfer chamber 16 and toward the floor of the transfer chamber. The light 36 is reflected from a reflector 40 back toward the reflex sensor 38 and the returning light beam is detected by the detector within the reflex sensor 38. A particularly preferred embodiment of the present invention uses a corner cube prism as the reflector 40. A corner cube has the property of reflecting all light rays incident within a given solid angle from the normal to the surface of the corner cube back toward their source. A corner cube prism generally has the form of a cube cut along a diagonal plane of the cube so that only a single corner of the cube is left intact. When used as a reflector, the corner cube is disposed so that light is incident on the diagonal plane and is substantially directed to the remaining corner of the cube. Light rays incident on the surface of a corner cube reflector are reflected back toward their source even if the surface of the corner cube is not perpendicular to the incident light rays. Accordingly, corner cubes need not be precisely aligned when used as the reflector 40 of the present invention. By contrast, if a mirror is used as the reflector 40, the position sensor would have to be more precisely aligned, and might be more susceptible to vibration. The corner cube may be, for example, a Stock No. 42.0015 Corner Cube Prism manufactured by Rolyn Optics Company of Covina, Calif.

Preferably, the reflex sensor 38 is mounted to the window 34 by a holder 44 that allows slight alignment adjustments of the reflex sensor 38. The holder 44 should be stable to maintain the alignment of the reflex sensor 38 during the normal operation of the wafer processing system. Similarly, the reflector 40 is preferably securely mounted to the bottom of the transfer chamber cover by a stable holder 46. The holders 44 and 46 are preferably disposed so that the optical path between the reflex sensor 38 and the reflector 40 will intercept the edge of a wafer 10 being transported by a wafer transport robot 18 at a position disposed away from the edge of the blade 20 (not shown in FIG. 2) of the wafer transport robot 18.

The position sensor of FIG. 2 has a number of advantages for use in the wafer positioning system of the present invention. The reflex sensor 38 preferably emits and detects modulated visible red light, allowing the reflex sensor to discriminate the wafer positioning signal from the visible background radiation typically present in wafer processing environments. Synchronizing the optical detector within the reflex sensor 38 with the modulation signal used to modulate the input red light signal reduces the likelihood of erroneous signal detection. Erroneous signals are further limited by the preferred detection geometry of the FIG. 2 sensor. The reflex sensor 38, beam path 36 and the normal to the surface of the reflector 40 are all situated at an oblique angle to the surfaces of the window 34 in the central cover 30, reducing the possibility of detecting light reflected either by the window 34 or the wafer 10. This geometry also limits the possibility that a background or ambient light source will erroneously be detected by the position sensor as a wafer position signal.

The preferred reflex sensor 38 has the further advantage that the detector output switches between two signal levels, which correspond to the typical logical one and zero of computer systems, when the intensity of the light incident on the detector rises above or falls below a predetermined threshold level. Accordingly, the output of the reflex sensor is readily compatible with the computer which controls wafer transport and the wafer positioning system of the present invention. If an optical detector is used which outputs signals which are not directly computer compatible, then it ordinarily will be necessary to convert the detector output to a computer compatible signal. Methods for performing such signal conversion are well known in the art.

Figure 3:
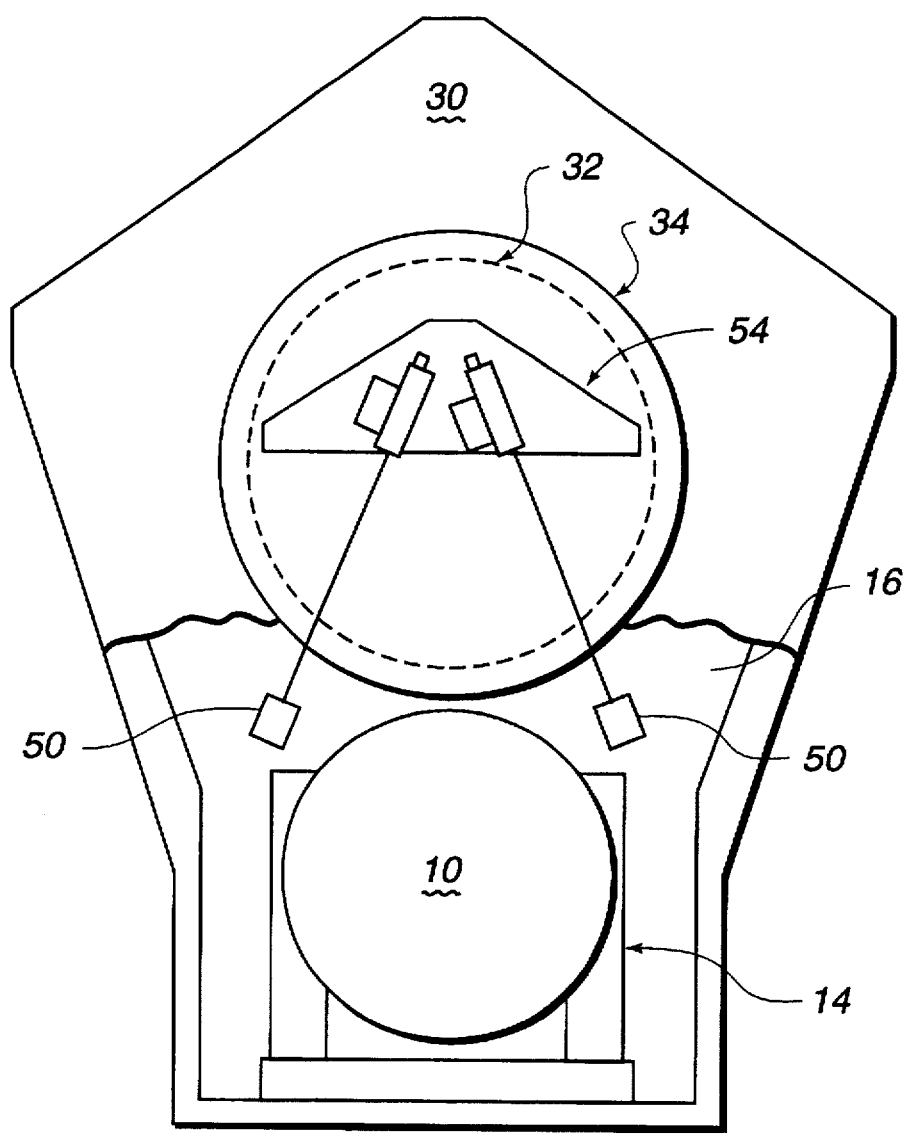
FIG. 3 is a top view of a wafer positioning system in accordance with the present invention.

FIG. 3 illustrates the preferred sensor assembly for the present invention. Two reflex sensors 38 and two corner cube reflectors 50 are installed in the FIG. 3 wafer processing system so that each of the two position sensor assemblies function like the position sensor of FIG. 2. The two assemblies are preferably installed so that a wafer disposed at its nominal position on the blade 20 of the wafer transport robot (not shown in FIG. 3) will interrupt the respective beam paths 52 of the preferred position sensors at substantially the same linear extension of the wafer transport robot. Furthermore, the two position sensor assemblies should be installed so that the respective beam paths 52 are not ordinarily incident on the blade 20 (not illustrated) of the wafer transport robot. The reflex sensors 38 are preferably mounted to a plate 54 on the surface of the window 34 so that the reflex sensors 38 direct light through the transfer chamber 16 at an angle oblique to the plane of the window 34 and oblique to the plane in which the semiconductor wafer is transported. The reflex sensors 38 and corner cubes 50 are respectively mounted to define a preferred plurality of beam paths 52. Mounting of the respective position sensor assemblies is preferably accomplished so that the beam paths 52 intersect the plane of wafer transport at a position equidistant from the back position of the wafer transport robot (not shown). The back position of the wafer transport robot is defined as the position in which the wafer transport robot is rotationally aligned with the wafer storage elevator and the linear extension of the robot is fully withdrawn from the wafer storage elevator. Cabling, schematically illustrated in FIG. 2, connects the output of the position sensors to the microcontroller 68, which in turn is connected to the computer 22 of the processing system.

When the stepper motor advances the wafer so that either the leading or the trailing edge of the wafer crosses the beam path of the preferred position sensor, the output of the position sensor changes state. That is, the output of the sensor changes indicating either that the beam path has been blocked or that a previously blocked beam path has been opened. Preferably, the output of the position sensor switches between two states, one of which corresponds to a voltage associated with a logical one and the other of which corresponds to a voltage associated with a logical zero. Alternatively, the output of the sensor can be coupled to circuitry, such as an analog to digital converter (ADC), to convert the sensor output to a computer compatible signal. In preferred embodiments of the present invention, the outputs of the sensors are monitored on a regular basis to determine if the sensors have changed state in response to the most recent incremental displacement. For example, the stepper motors may be operated by a microcontroller 68 that generates an interrupt for each step. The step interrupt generated by the linear translation stepper motor increments a counter which counts how many steps the wafer transport robot has moved away from the back position of the wafer transport robot. This step interrupt can be used to trigger a state check on each of the sensors. When the state check indicates that the state of one of the sensors has changed since the last state check, the microcontroller 68 transmits the step count associated with that change to the computer 22 for the processing system. The computer 22 stores the step count, or another representation of the wafer transport robot position, associated with the state change in the sensor.

Preferably, the step count associated with a state change in a position sensor is converted into a position value corresponding to the linear extension of the wafer transport robot. Typically, a step count is converted into a distance corresponding to the displacement of the wafer transport robot away from its back position measured in mils (thousandths of an inch). The processing system computer 22 may, for example, convert a step count into a distance by means of a lookup table. It is generally preferable to use a lookup table to convert step counts to distance because of a nonlinear relationship between step count and distance. Thus, the data from which the wafer position is calculated are the distances by which the wafer transport robot has been extended away from its back position when each of the position sensors change state.

Sensor Calibration Procedure

In the initial setup of a sensor system for a particular processing system, it will typically be necessary to ascertain the exact position of the sensors with respect to the wafer travel path. A calibration is necessary to determine, for example, the nominal center position of a wafer within the processing system. The position information derived from the calibration procedure is generally stored for use in future determinations of wafer position. This is most easily accomplished by calibrating the sensor system as installed in the processing system with the particular combination of position sensors, stepper motors, linear and rotational translation linkages, wafer transport blade and storage elevator that comprise the wafer handling system of the processing system. Typically, a calibration such as this will need to be performed after the initial installation of the position sensors in the processing system and whenever the alignment of the sensors or the wafer handling system is altered after initial installation.

The calibration procedure preferably begins with a wafer disposed in the top slot of the wafer storage elevator. Upon initiation of the calibration routine, the wafer transport robot extends the wafer transport blade to the wafer storage elevator and withdraws the wafer from the top slot of the wafer storage elevator. The wafer transport robot returns to the back position, with the wafer transport blade rotationally aligned with the wafer storage elevator and withdrawn from the elevator. It is important that the wafer be located in its nominal position with respect to the wafer transport blade throughout the calibration procedure. For wafer transport blades which have a well or pocket, the wafer is preferably centered in the pocket. In wafer processing systems which use a center finder of the type described in U.S. Pat. No. 4,819,167, a wafer will be disposed at a well defined position within the wafer storage elevator immediately after the wafer is loaded into the wafer storage elevator from the external wafer cassettes. Accordingly, when the wafer transport robot withdraws such a newly loaded wafer from the wafer storage elevator, the wafer will be disposed at its nominal position with respect to the wafer transport blade. If necessary, visual inspection can be used to ensure that the wafer is in its nominal position for the calibration procedure.

Figure 4:
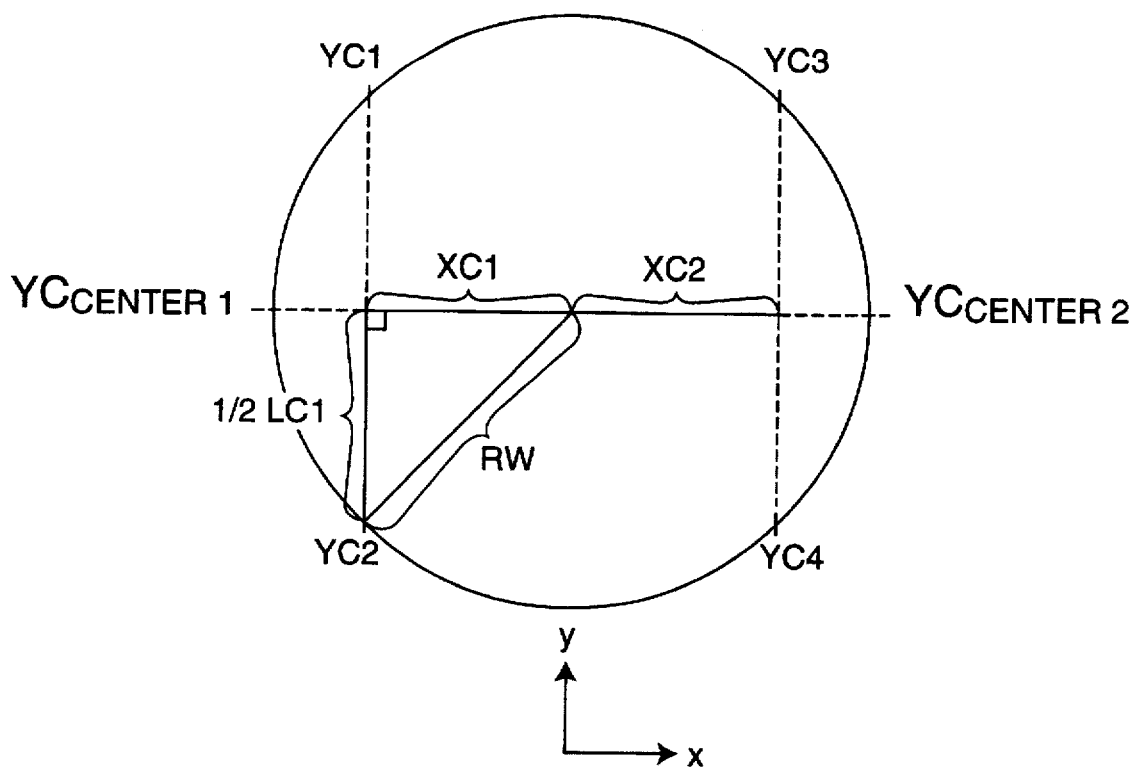
FIG. 4 illustrates a coordinate system, a set of calibration data points and a set of calibration constants used in a preferred embodiment of the present invention.

Starting with the wafer transport robot in the back position, the wafer is transported toward the elevator so that the leading edge of the wafer breaks the beam paths of the sensors. Generally, the wafer will break the sensor beam paths at different points in the wafer translation and separate distance data points will be generated as the wafer breaks each beam path. Additional data points are generated as the wafer travels farther toward the wafer storage elevator and the trailing edge of the wafer passes through each of the sensor beam paths. Each forward translation of the wafer through the beam path positions preferably produces four data points YC1, YC2, YC3, and YC4 as indicated in FIG. 4.

A number of calibration constants are preferably calculated from the four calibration data points. Referring to the coordinate system illustrated in FIG. 4, a Y value for the wafer center can be calculated from the pairs of data points generated by each sensor. $YC_{CENTER1}$ is calculated from YC1 and YC2; $YC_{CENTER2}$ is calculated from YC3 and YC4. The calibration $YC_{CENTER}$ value is then the average of $YC_{CENTER1}$ and $YC_{CENTER2}$.

$$YC_{CENTER1} = \frac{YC1 + YC2}{2} ;$$

$$YC_{CENTER2} = \frac{YC3 + YC4}{2} ;$$

$$YC_{CENTER} = \frac{YC_{CENTER1} + YC_{CENTER2}}{2} .$$

A line between YC1 and YC2 is a chord of the circle defined by the outer edge of the wafer illustrated in FIG. 4. The chord from YC1 to YC2 is separated from the X-axis centerline of the circle by a distance XC1. Similarly, the chord from YC3 to YC4 is separated from the X-axis centerline of the circle by a distance XC2. XC1 and XC2 may be calculated from the four calibration data points (YC1, YC2, YC3 and YC4) in a number of ways. A preferred calculation technique is described herein with reference to FIG. 4. In this discussion, the term RW refers to the radius of the wafer being processed, a constant for a particular size wafer, measured in the distance units used to describe the position of the calibration points.

The line segment XC1 extending from the wafer center is perpendicular to the chord YC1 to YC2. Chord YC1 to YC2 has a length LC1. Thus, the right triangle indicated in FIG. 4 has one leg of length XC1, one leg of length ½·LC1 and a hypotenuse of length RW. XC1 may then be calculated from the Pythagorean theorem as follows:

$$XC1 = \sqrt{RW^2 - \frac{1}{4} \cdot (YC1 - YC2)^2} .$$

Similarly, the length XC2 can be calculated from the YC3 and YC4 data points as follows:

$$XC2 = \sqrt{RW^2 - \frac{1}{4} \cdot (YC3 - YC4)^2} .$$

The calibration data points are preferably the result of repeated measurements. In particular, the data points YC1, YC2, YC3 and YC4 may be the average of ten successive measurements. Alternatively, a value of $YC_{CENTER}$, XC1 and XC2 may be determined each time a set of data points YC1, YC2, YC3 and YC4 is taken and average $YC_{CENTER}$, XC1 and XC2 values may be calculated from, for example, ten sets of $YC_{CENTER}$, XC1 and XC2 values derived from ten sets of data point measurements. Once average $YC_{CENTER}$, XC1 and XC2 values have been determined for a wafer in its nominal position, these calibration values are stored in the control computer for use in future wafer position determinations. These calibration values will ordinarily not be redetermined unless the position of the sensors or wafer transport robot are changed. Recalibration will be necessary after major servicing of these assemblies.

Determining Wafer Positions During Processing

A wafer positioning system in accordance with the present invention may be used to determine the position of wafers undergoing processing, thereby reducing levels of wafer breakage. Wafer positions are preferably determined each time a wafer is removed from a processing chamber to be transported to the wafer storage elevator. It may be desirable to determine wafer positions for transfers of wafers between processing chambers if it is found that such information is sufficiently helpful in preventing wafer breakage. Similarly, a wafer position determination may also be made as a wafer is transfered from the wafer storage elevator to a chamber for further processing.

Data points are collected by transporting a wafer towards the wafer storage elevator. To collect the necessary data the wafer transport robot is moved to its back position, which is defined by the wafer transport robot being rotationally aligned with the storage elevator and the linear translation being fully withdrawn away from the elevator. In accordance with one embodiment of the present invention, the wafer is linearly translated away from the back position toward the wafer storage elevator until the leading edge of the wafer intercepts one or both of the sensor beam paths. The intersection of the leading edge of the wafer with a beam path defines the respective YP1 or YP3 positions. Generally, the YP1 and YP3 data points will occur at different linear extensions of the wafer transport robot. If, however, the YP1 and YP3 data points are collected at the same linear extension corresponding to the nominal position of a properly positioned wafer, or within a predefined range of that nominal extension, then the wafer is properly positioned. In accordance with this embodiment, if this condition is identified by the control computer, then no further position data is collected for this wafer transport operation. Since the wafer position has been verified as within an acceptable range of its nominal position, the wafer is transported to its intended destination.

If the linear extension at which the YP1 data point is collected differs from that at which the YP3 data point is collected by more than a predetermined range, the wafer being transported is not at its nominal position. Similarly, if the linear extensions for the YP1 and YP3 data points are substantially equal but occur at other than the nominal linear extension, the wafer being transported is not at its nominal position. When the wafer is not at its nominal position, the wafer might be displaced either positively or negatively with respect to its nominal position. To ensure that the leading edge of the wafer is detected by the position sensors, the wafer transport robot is withdrawn to its back position and once again translated toward the wafer storage elevator. The rate of wafer translation away from the back position is preferably the optimal speed for positional measurements. Extension of the wafer transport robot continues until first the YP1 and YP3 data points and then the YP2 and YP4 data points are collected. Once the data points have been obtained, Y centerline data and X positional data XP1 and XP2 are calculated. These values are preferably calculated in a manner similar to that used to determine the calibration values described above.

Preferably, wafer transport is accomplished to optimize the time required to ascertain wafer position. It is desirable to transport wafers as quickly as possible through the wafer processing system to maintain high wafer throughput. On the other hand, the accuracy of the wafer position determination made by the wafer positioning system of the present invention is reduced by translating the wafer rapidly through the sensor beam paths.

Figure 5:
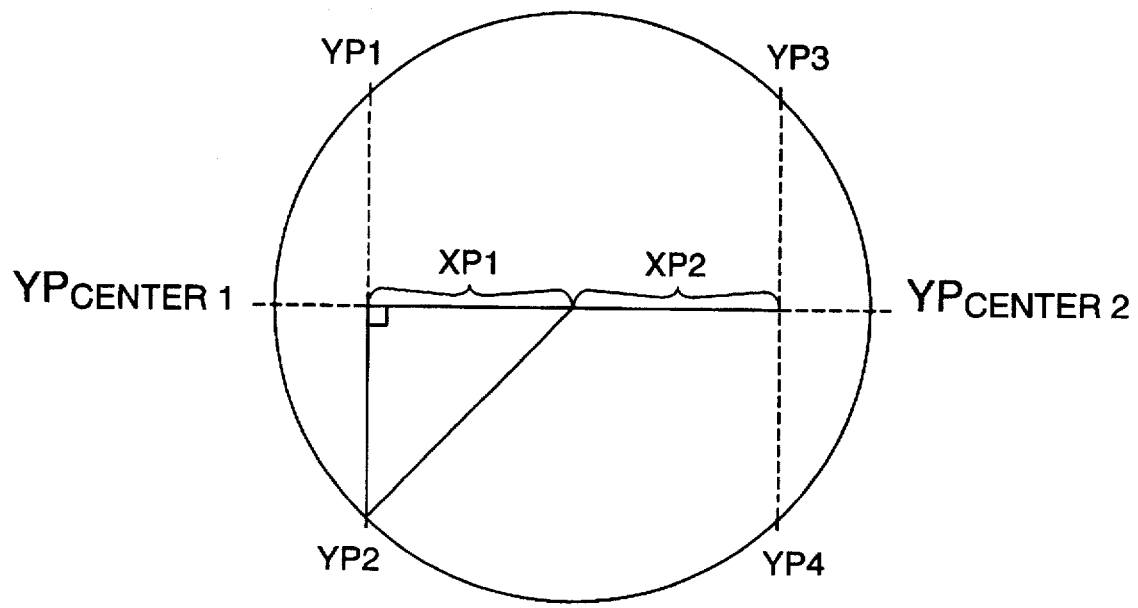
FIG. 5 illustrates the data points and position data collected by a preferred embodiment of the present invention.

FIG. 5 illustrates the data collection geometry preferably used for determining the position of wafers being transported through the wafer processing system. In general, the wafer will not be disposed symmetrically with respect to the beam paths of the preferred position sensors. Accordingly, the chords YP1 and YP2 and YP3 to YP4 are displaced by unequal distances XP1 and XP2 from the centerline of the wafer. In addition, data point YP1, YP3 and YP2, YP4 will typically be collected at significantly different extensions of the wafer transport robot.

Referring to the coordinate system indicated on FIG. 5, a Y value for the wafer center can be calculated from the pair of data points generated by each sensor. $YP_{CENTER1}$ is calculated from YP1 and YP2 and $YP_{CENTER2}$ is calculated from YP3 and YP4. The calibration $YP_{CENTER}$ value is then the average of $YP_{CENTER1}$ and $YP_{CENTER2}$.

$$YP_{CENTER1} = \frac{YP1 + YP2}{2};$$

$$YP_{CENTER2} = \frac{YP3 + YP4}{2};$$

$$YP_{CENTER} = \frac{YP_{CENTER1} + YP_{CENTER2}}{2}.$$

A line between YP1 and YP2 is a chord of the circle defined by the outer edge of the wafer illustrated in FIG. 4. The chord from YP1 to YP2 is separated from the Y-axis centerline of the circle by a distance XP1. Similarly, the chord from YP3 to YP4 is separated from the X-axis centerline of the circle by distance XP2. XP1 and XP2 may be calculated from the four process wafer data points (YP1, YP2, YP3 and YP4) in a number of ways. Preferably the calculation technique described above with respect to the calibration procedure is also used to calculate the centerline positions of wafers during processing. XP1 may then be calculated as follows:

$$XP1 = \sqrt{RW^2 - \frac{1}{4} \cdot (YP1 - YP2)^2}.$$

Similarly, the length XP2 can be calculated from the YP3 and YP4 data points as follows:

$$XP2 = \sqrt{RW^2 - \frac{1}{4} \cdot (YP3 - YP4)^2}.$$

Error Determination and Correction of Wafer Misalignment

Figure 6:
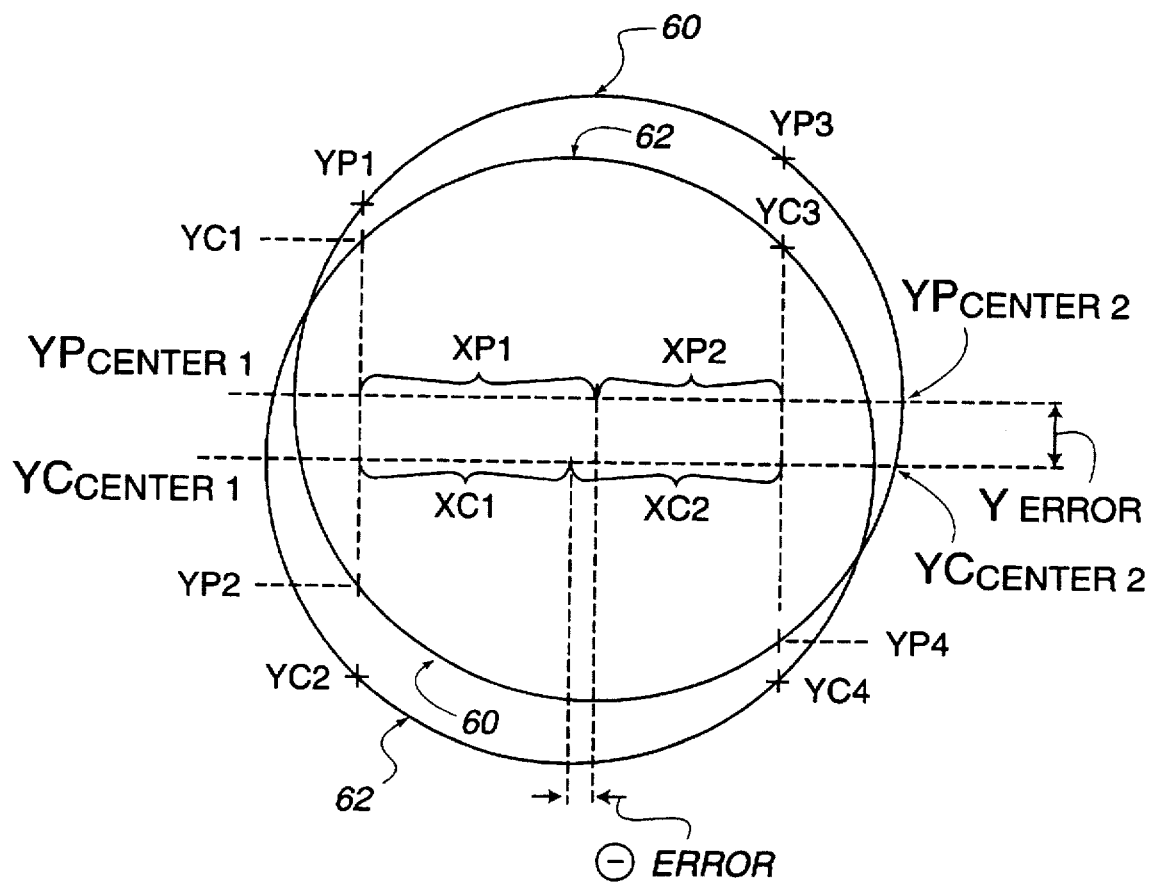
FIG. 6 illustrates a determination of position correction information in accordance with a preferred embodiment of the present invention.

FIG. 6 illustrates the determination of the error in the wafer position using the wafer positioning system of the present invention. In particular, FIG. 6 shows the relative position of a wafer 60 displaced away from its nominal position (as is illustrated by FIG. 5) with respect to a wafer 62 disposed at its nominal position (as is illustrated in the FIG. 4 illustration of the calibration procedure). As can be seen from the overlaid wafer positions, the points (YP1, YP2, YP3 and YP4) at which the edge of the displaced wafer 60 triggers the position sensors occur at different positions along the wafer edge than do similar points (YC1, YC2, YC3 and YC4) along the edge of a wafer disposed at its nominal position. Thus, the Y coordinate of the center of the displaced wafer 60 is different from the Y coordinate of the center of the nominal wafer position and the lengths of the XP1 and XP2 segments are different from the lengths of the segments XC1 and XC2 corresponding to the nominal wafer position.

The difference in the Y coordinates of the centers of the two wafers reflects the distance by which the wafer 60 is displaced away from its nominal position along the Y-axis of the wafer. This $Y_{ERROR}$ can be corrected by adjusting the linear extension of the wafer transport robot. $Y_{ERROR}$ can be calculated as follows:

$$\Theta_{ERROR} = \frac{YC_{CENTER1} - YP_{CENTER1}}{2} + \frac{YC_{CENTER2} - YP_{CENTER2}}{2}.$$

Similarly, the difference in lengths of the line segments XC1, XP1 and XC2 and XP2 reflects the distance by which the wafer 60 is displaced away from its nominal position along the X axis of the wafer. This $\Theta_{ERROR}$ can be corrected by adjusting the rotation of the wafer transport robot by an appropriate amount to produce the desired displacement at the destination of the wafer. $\Theta_{ERROR}$ can be calculated as follows:

$$\Theta_{ERROR} = \frac{XC1 - XP1}{2} + \frac{XP2 - XC2}{2}.$$

The equations listed above represent particularly preferred error calculations for a wafer positioning system in accordance with the present invention. These calculations preferably incorporate an average between two independent sets of experimental data points (YP1, YP2 and YP3, YP4), but the calculations could also be performed as single data set calculations. Taking the average of two data sets is particularly preferred in the present invention because the present wafer positioning system preferably does not detect wafer flats or notches, and preferably does not alter its calculations to compensate for the detection of a wafer flat. The positioning errors introduced by flats on wafers of 100 mm or more in diameter are relatively small. By averaging two sets of position data, preferred embodiments of the present invention further reduce the impact of detecting a wafer edge at the position of a wafer flat without incurring the added complexity and the more time consuming processing associated with a system having more position sensors which compensates for the detection of a wafer flat.

To correct the wafer position in light of these error determinations, the $Y_{ERROR}$ value preferably is converted into step counts at the destination point of the wafer and added to the original destination extension step count location. The rotation error $\Theta_{ERROR}$ preferably is converted into step counts at the destination point and added to the original destination rotation step count. In some preferred embodiments of the present invention, the displacement errors $Y_{ERROR}$ and $\Theta_{ERROR}$ are monitored by the computer of the processing system. If these values exceed some predetermined correction range, the processing system does not make the indicated displacement correction. Rather, the system pauses operation, issues an alarm and awaits inspection by an operator.

Under some wafer misalignment conditions, it is possible that the wafer could block one or more of the sensors while the wafer transport robot is in its back position. Alternatively, a wafer may be misaligned to such an extent that the wafer only crosses one of the wafer position sensor positions during a normal transport operation. These conditions could cause errors in detecting wafer misalignment or in the wafer offset calculations. Preferred embodiments of the present invention utilize a routine which detects the occurrence of such wafer misalignments, and adjusts the wafer misalignment detection procedures to compensate for the conditions. This procedure preferably further includes an initialization routine that can be performed periodically to determine if the wafer position sensors are operating properly.

A process flow utilized by a preferred embodiment of a wafer positioning system is illustrated in the flowcharts of FIG. 7(a)–7(f). This flowchart generally illustrates the procedure used to transfer a wafer to the wafer elevator. Thus, at the "entry" point 70 indicated in FIG. 7(a), the wafer transport robot has lifted a wafer from a processing chamber and is ready to transport the wafer back to the elevator. A similar process flow might be used for other transport operations within the wafer processing system, such as transport between chambers or a transfer between the wafer storage elevator and a processing chamber. The illustrated process may occur in the processing system computer, which preferably controls the operation of a microcontroller 68 which, in turn, controls stepper motor operation and the collection of wafer position data. Generally the computation and control functions illustrated in the flowcharts of FIGS. 7(a)–7(f) may be distributed as necessary for programming convenience and to optimize process throughput. It is often desirable to place control of the stepper motors and the interface to the wafer position sensors within a separate microcontroller to maximize the speed at which data may be collected. High speed data collection allows wafer position data to be accumulated at high rates of wafer transport.

On entering the wafer positioning routine, the processing system computer repeatedly checks 72 to determine if the chamber to elevator transfer flag has been set. When the flag is set, the wafer positioning routine proceeds 74 to move the wafer transport robot to its back position. First, the wafer is withdrawn from the chamber, then the wafer transport robot rotates to its extension position and finally the robot is withdrawn to its back position. The wafer positioning system then issues 76 a "static read" command, which causes the microcontroller 68 to check the output of the wafer position sensors. Data from the microcontroller 68 is read 78 into the processing system computer so that the computer can determine if the wafer position sensors are operational, i.e., that both sensors output signals indicating that they detect an optical signal. If a sensor does not detect an optical signal, the sensor may be inoperative or the wafer on the wafer transport robot may be so badly misaligned that the wafer is blocking the beam path of the wafer position sensor even while the robot is withdrawn to its back position.

The wafer positioning routine first checks 80 to determine if both sensors are blocked. If the routine determines 82 that both of the sensors are blocked, the routine will halt operation of the wafer processing system and issue an alarm to the system operator. This condition indicates either that both wafer position sensors have malfunctioned or that the wafer is so badly misaligned that the wafer positioning system cannot compensate for the misalignment.

If the wafer positioning routine determines 84 that neither of the sensors is blocked, i.e., that both sensors are operational and that the wafer misalignment is likely within a correctable range, then the routine issues 86 (FIG. 7b) a "dynamic read command" to the microcontroller 68 and the routine causes 87 the robot to extend to the full run position. The dynamic read command causes the microcontroller to clear its data storage registers and to begin monitoring the sensor outputs to detect a state change. In response to these commands, the wafer transport robot is stepped forward and data is collected as the wafer passes through the position sensors. In this mode of operation, a total of four data points (YP1, YP2, YP3 and YP4) are collected by the microcontroller 68 as the wafer transport robot extends from its back position. The routine then causes the processing system computer to read 88 the four data points from the microcontroller 68, calculate 90 the length of the x-axis offsets XP1 and XP2 (FIG. 5), and calculate 92 (FIG. 7b) the wafer center position. By comparing the measured wafer position with the calibration wafer position, the routine determines 94 (FIG. 7c) whether the wafer is offset from its nominal position. In the alternative, the wafer positioning system can make a determination as to whether the wafer is offset from its nominal position on the basis of the first two data points collected (YP1 and YP3), as discussed above.

If the wafer is not offset from its nominal position or if the wafer is offset from its nominal position by a correctable amount, the routine causes 102 the wafer transport robot to deposit the wafer in the wafer storage elevator. If the wafer is offset from its nominal position by more than an acceptable amount, then the routine determines 96 whether the wafer offset is within a correctable range. Should the routine decide 96 that the wafer offset is outside of the correctable range, then the routine halts 98 operation of the wafer processing system, and sets an alarm to notify the system operator of the excessive wafer misalignment. Typically, the cost of each wafer start justifies a temporary suspension of a processing operation to ensure that no wafers are broken. Additionally, if one wafer is offset by an uncorrectable amount, there may be a systemic problem that could lead to further misalignments. Accordingly, it is typically preferred to halt system operation if an uncorrectable wafer misalignment occurs.

If, on the other hand, the routine determines 96 that the wafer is offset by a correctable amount, the processing system computer sends 100 wafer position correction information to the wafer transport robot. The routine then causes 102 the wafer transport robot to deposit the wafer in the wafer storage elevator. Once the wafer has been deposited in the wafer storage elevator, the routine causes 104 (FIG. 7d) the wafer transport robot to return to its back position. No wafer should be on the blade of the wafer transport robot at this time. The routine then sends 106 a static read command to the microcontroller 68 and then the routine reads 108 the wafer position sensor output data. If the processing system computer determines 110 that both of the sensors are unblocked, then the routine returns to the entry point 70 (FIG. 7a) to await the next wafer transfer operation. Should both of the sensors output data corresponding to the sensors being blocked, the routine interprets this condition as both sensors having failed, and the routine halts 112 (FIG. 7d) the system in response to the hardware failure.

The preceding description was directed to the process flow used when a wafer is sufficiently centered on the wafer transport robot so that both of the wafer position sensors can be utilized for gathering wafer positioning data. If the processing system computer determines (at step 84 FIG. 7a) that a single sensor is blocked when the robot is withdrawn into its back position, the wafer positioning routine transports the wafer an additional distance to determine if the wafer is sufficiently centered on the wafer transport robot to perform a wafer misalignment measurement using a single sensor and a single set of wafer position data. If data can be obtained from at least one sensor, it is typically preferable to allow the wafer processing system to correct the wafer position and to continue operation. Of course, if practical experience indicates that unacceptable levels of wafer loss are associated with wafer misalignment corrections made in accordance with data from a single sensor, then this practice may be discontinued. In this regard, it is preferred that the processing system computer keep records of the wafer offset adjustments made. Preferably, these records should include an identification of the particular wafer processed when each offset adjustment is made.

Figure 7A:
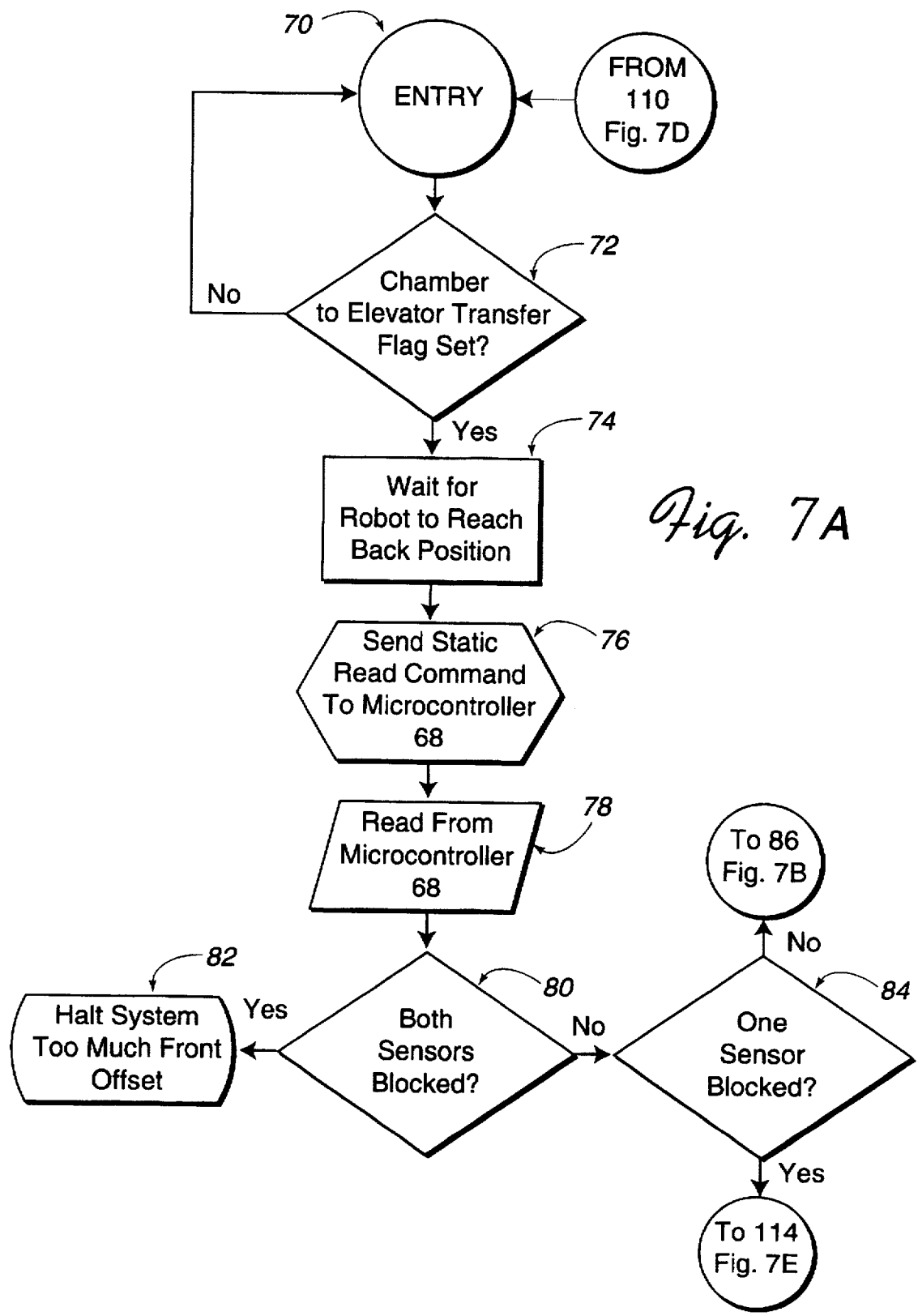
FIGS. 7(a)–7(f) are flowcharts illustrating the operation of a preferred embodiment of the present invention.
Figure 7B:
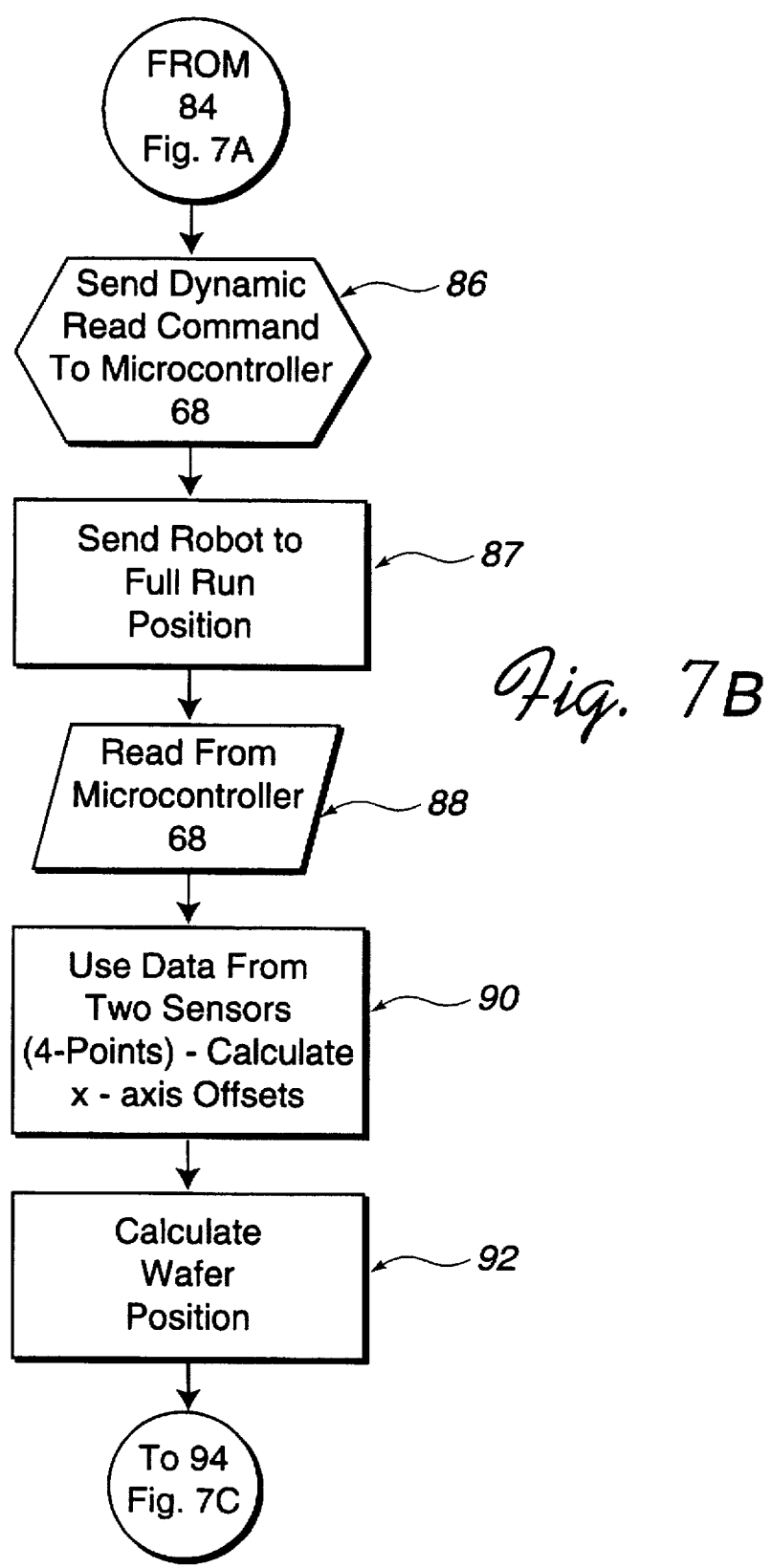
Figure 7C:
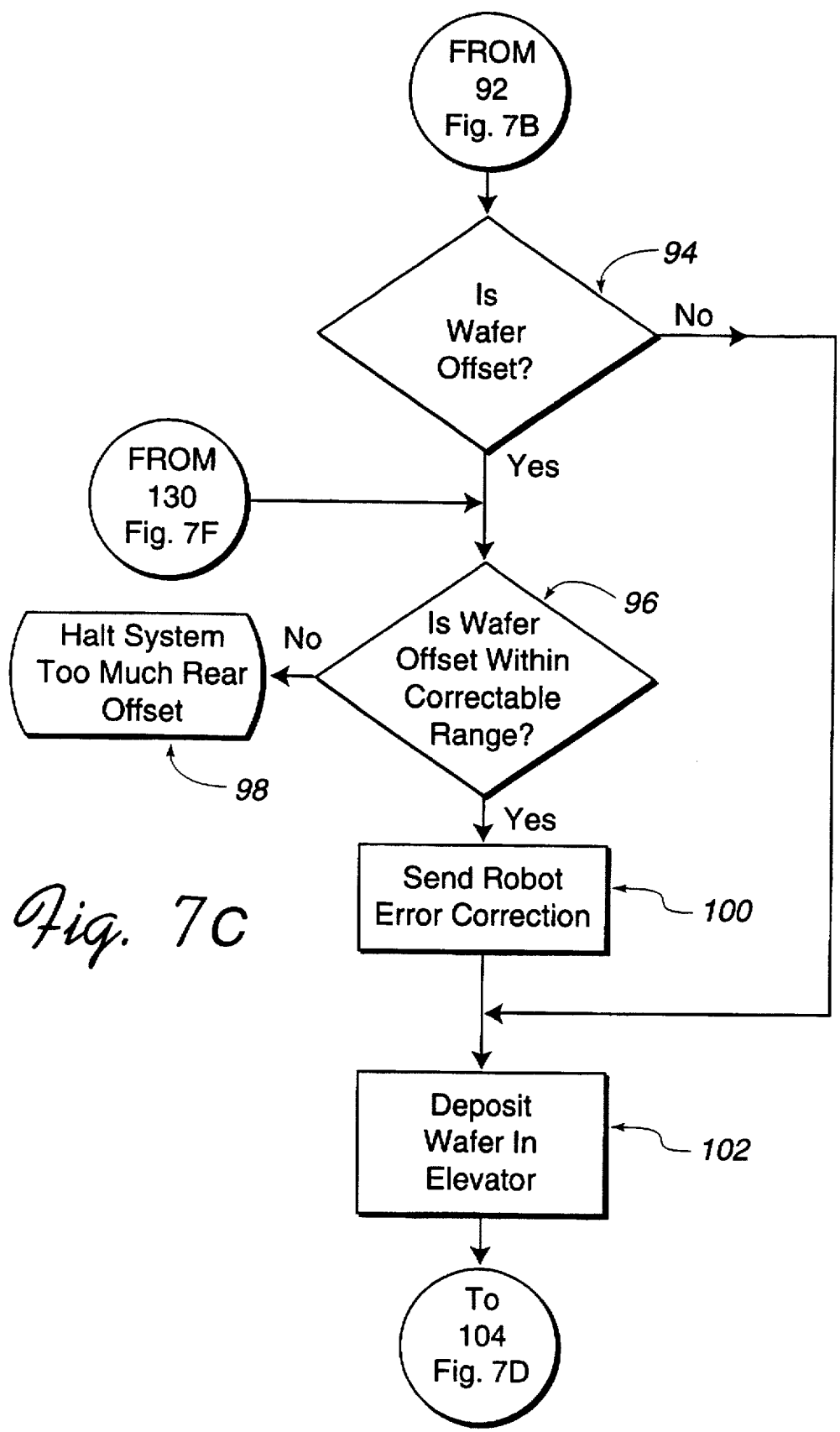
Figure 7D:
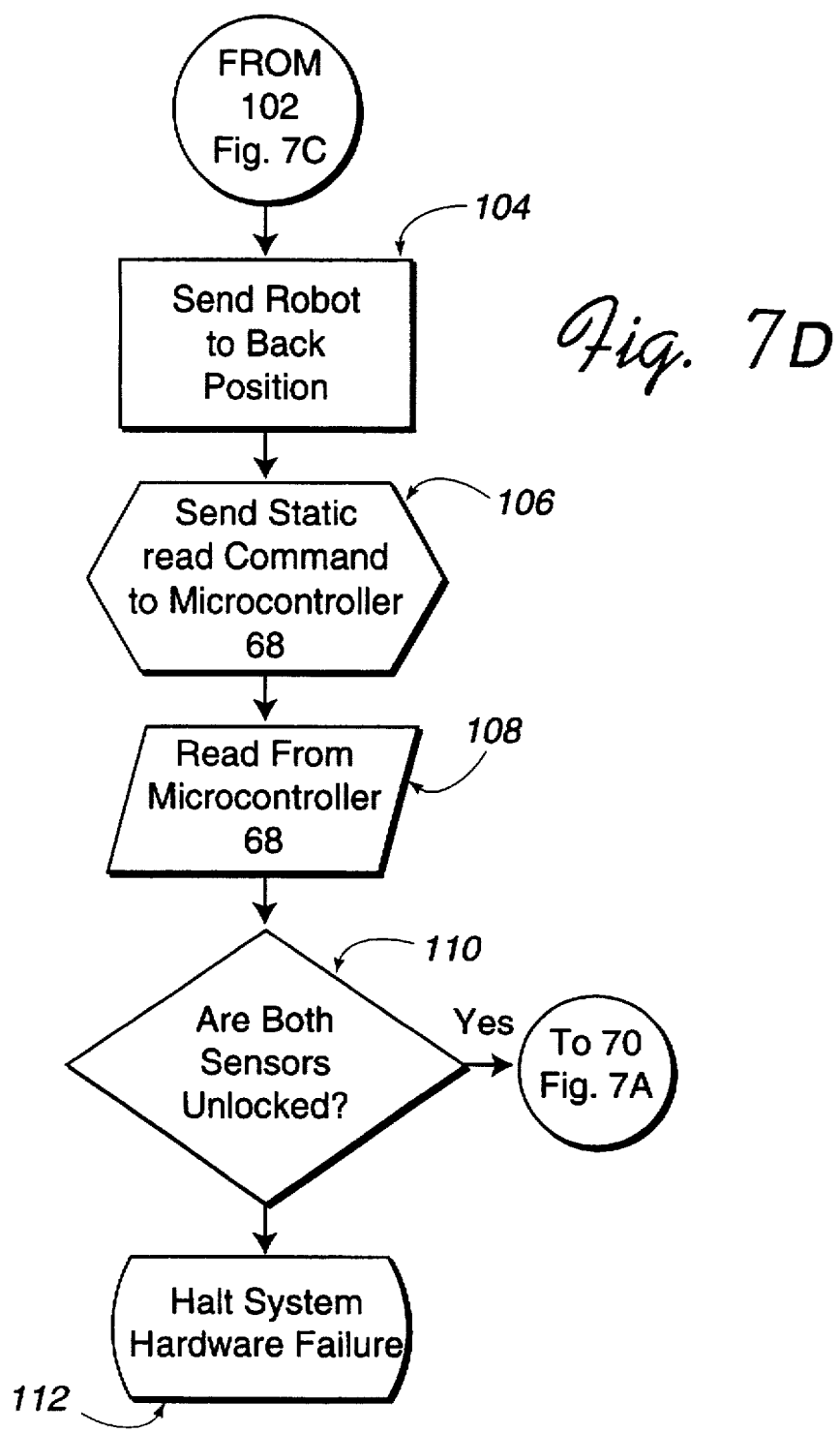
Figure 7E:
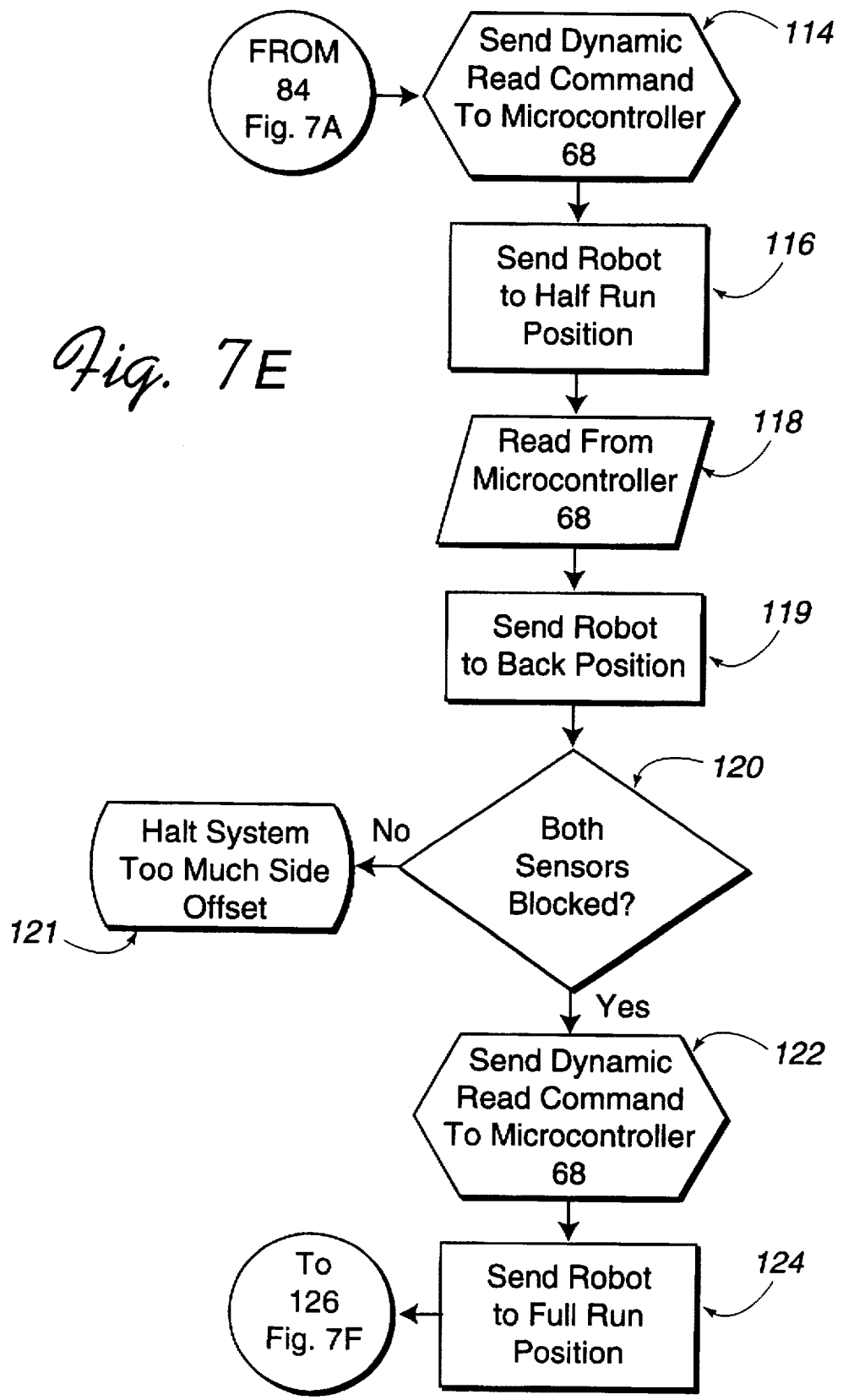
Figure 7F:
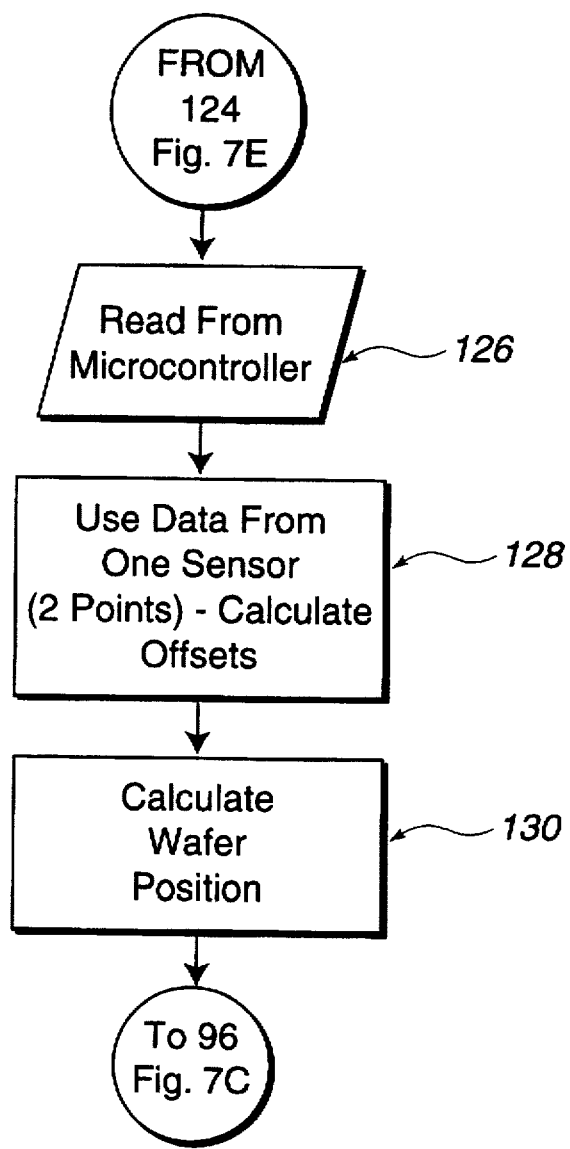

The process flow for correcting wafer misalignments using data from a single sensor is also illustrated in FIGS. 7(a)–7(f) and, in particular, in FIGS. 7(e) and 7(f). If the processing system computer determines 84 (FIG. 7a) that a single sensor is blocked when the wafer transport robot is at its back position, the wafer positioning routine sends 114 (FIG. 7e) a dynamic read command to the microprocessor 68 and then causes 116 the wafer transport robot to extend one half of the way to the wafer storage elevator. The microcontroller 68 collects data from the sensors as the wafer is extended to the half run position, which data are subsequently read 118 from the microcontroller by the processing system computer. The wafer transport robot is then sent 119 to the back position. If the data collected by the microcontroller 68 as the robot extends to the half run position indicate that both sensors are not blocked at the half run position, the wafer is typically offset too far to one side for the offset to be reliably corrected. Accordingly, if the routine determines 120 that both sensors are not blocked in the half run position, then the routine will halt 121 the wafer processing system and issue an alarm to the system operator indicating the wafer misalignment condition.

If instead the processing system computer determines 120 that both sensors are blocked when the wafer transport robot is at its half run position, the computer will send 122 a dynamic read command to the microprocessor 68 and then cause 124 the robot to extend from its back position to the full run position. As before, this sequence of commands causes the microcontroller 68 to transport the wafer past the position sensors and to collect data. These data are read 126 (FIG. 7f) from the microcontroller 68 and the computer will calculate 128 the relative offsets from the two data points collected from the sensor that was not blocked when the wafer transport robot was at its back position. The routine then calculates 130 the wafer offset and proceeds to determine 96 (FIG. 7c) if the wafer offset is within a correctable range. If the offset is within an acceptable range, correction data are sent 100 to the robot and then the routine causes 102 the robot to transport the wafer to the elevator. The system then proceeds through steps 104–110, as indicated on FIG. 7(d), before returning control to the entry point 70 (FIG. 7a) of the routine. On the other hand, if the routine determines 96 that the offset is too great, the routine will halt 98 operation of the processing system.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. A wafer positioning system comprising:
 a wafer handling chamber, said wafer handling chamber having at least a portion of a wall formed from a substantially transparent material;
 a wafer storage apparatus within said wafer handling chamber having a plurality of locations for storing wafers;
 a wafer transport robot capable of translating a wafer along a first coordinate direction and along a second coordinate direction, said wafer transport robot having a blade adapted for carrying wafers; and
 at least one position sensor comprising:
  a light source disposed external to said wafer handling chamber, said light source aligned to direct an incident beam of light through said substantially transparent material into said wafer handling chamber;
  a reflector disposed within said wafer handling chamber so that at least a portion of said incident beam of light is reflected from said reflector as a reflected beam of light, wherein said reflector directs said reflected beam of light through said substantially transparent material; and
  a detector disposed external to said wafer handling chamber to receive said reflected beam of light from said reflector, wherein said light source and said detector are disposed to detect an edge of said wafer when said wafer intercepts a beam of light as said wafer is transported from said wafer storage apparatus to a position within said wafer handling chamber disposed away from said wafer storage apparatus;

means for detecting a position of said wafer transport robot as said edge of said wafer intersects both a first detection position and a second detection position within said wafer handling chamber;

a converter which generates an interrupt signal; and means for checking the state of said position sensor in response to said interrupt signal.

2. A wafer processing system of claim 1, wherein the converter is a servo motor controller to provide the interrupt signal to the means for checking the state of said position sensor.

3. A wafer processing system of claim 1, wherein the converter is a feedback device to provide the interrupt signal to the means for checking the state of said position sensor.

* * * * *